US012591032B2

(12) United States Patent
Li et al.

(10) Patent No.: US 12,591,032 B2
(45) Date of Patent: Mar. 31, 2026

(54) AUTOMATIC CALIBRATION METHOD AND AUTOMATIC CALIBRATION EQUIPMENT FOR TESTING PROBE SET USED IN SEMICONDUCTOR PROCESS

(71) Applicant: United Microelectronics Corp., Hsinchu (TW)

(72) Inventors: Zheng-Yang Li, Kaohsiung City (TW); Chia-Chan Tsai, Tainan City (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 226 days.

(21) Appl. No.: 18/406,240

(22) Filed: Jan. 8, 2024

(65) Prior Publication Data

US 2025/0180687 A1     Jun. 5, 2025

(30) Foreign Application Priority Data

Nov. 30, 2023    (TW) ................................. 112146601

(51) Int. Cl.
| | |
|---|---|
| *G01R 35/00* | (2006.01) |
| *G01R 31/319* | (2006.01) |
| *G01R 1/067* | (2006.01) |

(52) U.S. Cl.
CPC ....... G01R 35/005 (2013.01); G01R 31/3191 (2013.01); *G01R 1/0675* (2013.01)

(58) Field of Classification Search
CPC . G01R 31/3191; G01R 35/005; G01R 1/0675
See application file for complete search history.

(56) References Cited

U.S. PATENT DOCUMENTS

| | | | |
|---|---|---|---|
| 6,512,387 B1 * | 1/2003 | Bohn ..................... G01R 31/70 | |
| | | | 324/762.02 |
| 7,026,832 B2 | 4/2006 | Chaya et al. | |
| 7,750,622 B2 * | 7/2010 | Strom ................ G01R 31/2891 | |
| | | | 324/762.01 |

* cited by examiner

*Primary Examiner* — Alesa Allgood
(74) *Attorney, Agent, or Firm* — WPAT, PC

(57) ABSTRACT

An automatic calibration method and an automatic calibration equipment for a testing probe set used in a semiconductor process are provided. The automatic calibration method of the test probe set used in the semiconductor manufacturing process includes the following steps. A preliminary correction offset is analyzed according to an empirical needle mark of the test probe set. A relative position between the test probe set and a wafer to be tested are preliminarily adjusted according to the preliminary correction offset. The test probe set is used to perform a test procedure on the wafer to be tested. Whether the offset of the test probe set is within a predetermined specification is determined. If the offset of the test probe set exceeds the predetermined specification, the relative position between the test probe set and the wafer to be tested is further adjusted.

18 Claims, 5 Drawing Sheets

900

900

AUTOMATIC CALIBRATION METHOD AND AUTOMATIC CALIBRATION EQUIPMENT FOR TESTING PROBE SET USED IN SEMICONDUCTOR PROCESS

This application claims the benefit of Taiwan application Serial No. 112146601, filed Nov. 30, 2023, the disclosure of which is incorporated by reference herein in its entirety.

TECHNICAL FIELD

The disclosure relates in general to a processing method and an electronic equipment used in a semiconductor process, and more particularly to an automatic calibration method and an automatic calibration equipment for a testing probe set used in a semiconductor process.

BACKGROUND

In the semiconductor process, a Wafer Acceptance Test (WAT) is required to maintain the process yield. When performing the WAT, a test probe is used to contact the test pad on the wafer. The test probe needs to actually contact the test pad to perform the WAT correctly. However, the test probe often deflects when pressed down, and a long needle mark or an elliptical needle mark is formed on the test pad. The needle mark is the contact range between the test probe and the test pad. During the test process, it takes multiple trial shots or actual tests to align the needle mark with the center point of the test pad to obtain the most accurate test results.

SUMMARY

This disclosure relates to an automatic calibration method and an automatic calibration equipment for a testing probe set used in a semiconductor process, which can pre-adjust the relative position of the testing probe set relative to the wafer to be tested before actual testing or trial shotting, so that the needle mark can be aligned with the center point of the test pad to ensure test accuracy.

According to one embodiment, an automatic calibration method for a testing probe set used in a semiconductor process is provided. The automatic calibration method for the testing probe set used in the semiconductor process includes: analyzing a preliminary correction offset according to an empirical needle mark of the testing probe set; preliminarily adjusting a relative position between the test probe set and a wafer to be tested according to the preliminary correction offset; performing a testing procedure on the wafer to be tested by using the testing probe set; automatically determining whether an offset of the test probe set is within a predetermined specification; and further adjusting the relative position between the test probe set and the wafer to be tested, if the offset of the test probe set exceeds the predetermined specification.

According to another embodiment, an automatic calibration equipment for a testing probe set used in a semiconductor process is provided. The automatic calibration equipment for the testing probe set used in the semiconductor process includes an analyzing unit, a first correction unit, an automatic test unit and a second correction unit. The analyzing unit is configured to analyze a preliminary correction offset according to an empirical needle mark of the testing probe set. The first correction unit is configured to preliminarily adjust a relative position between the test probe set and a wafer to be tested according to the preliminary correction offset. The automatic test unit is configured to perform a testing procedure on the wafer to be tested by using the testing probe set, and then automatically determine whether an offset of the test probe set is within a predetermined specification. The second correction unit is configured to further adjust the relative position between the test probe set and the wafer to be tested, if the offset of the test probe set exceeds the predetermined specification.

Figure 1:
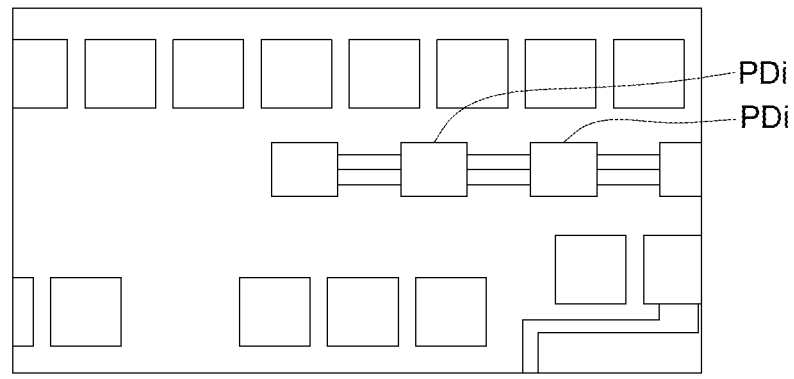
FIG. 1 illustrates a schematic diagram of a plurality of test pads of a wafer to be tested according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The technical terms used in this specification refer to the idioms in this technical field. If there are explanations or definitions for some terms in this specification, the explanation or definition of this part of the terms shall prevail. Each embodiment of the present disclosure has one or more technical features. To the extent possible, a person with ordinary skill in the art may selectively implement some or all of the technical features in any embodiment, or selectively combine some or all of the technical features in these embodiments.

In addition, some embodiments of the present disclosure may use spatially related terms (e.g., "below", "below", "lower", "above", "upper", etc.) to easily describe a feature shown in the figures or the relationship of a feature to another feature(s). These spatially relative terms are intended to cover different orientations of the element in use or operation in addition to the orientation shown in the figures. The element may otherwise oriented (rotated 90 degrees or at other orientations), and the spatially relative descriptors used in some embodiments of the present disclosure may be interpreted accordingly.

Please refer to FIG. 1, which illustrates a schematic diagram of a plurality of test pads PDi of a wafer 900 to be tested according to an embodiment of the present disclosure. In this embodiment, the test pads PDi of the wafer 900 to be tested are electrically connected to the chips in the wafer 900. A testing signal is inputted to the test pads PDi, to perform a electric testing on the chips in the wafer 900 to be tested, so that some chips with poor electrical function could be found.

Figure 2:
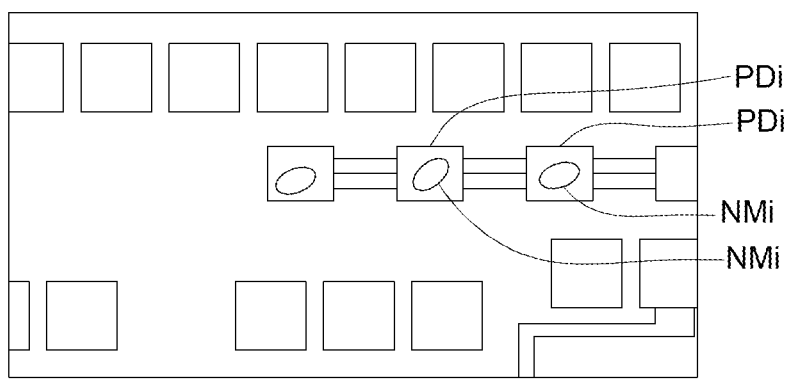
FIG. 2 shows a schematic diagram of a plurality of needle marks of a testing probe set according to an embodiment of the present disclosure.

Please refer to FIG. 2, which shows a schematic diagram of a plurality of needle marks NMi of a testing probe set 810 (shown in FIG. 4) according to an embodiment of the present disclosure. When the wafer 900 to be tested is performed the Wafer Acceptance Test (WAT), the testing probe set 810 is pressed down and in contact with the test pads PDi of the wafer 900 to be tested for electrical testing. The testing probe set 810 is usually composed of long probes arranged in a fan shape. When the testing probe set 810 is pressed down, there will be some slight offset, the needle marks NMi will be left on the test pads PDi.

Figure 3:
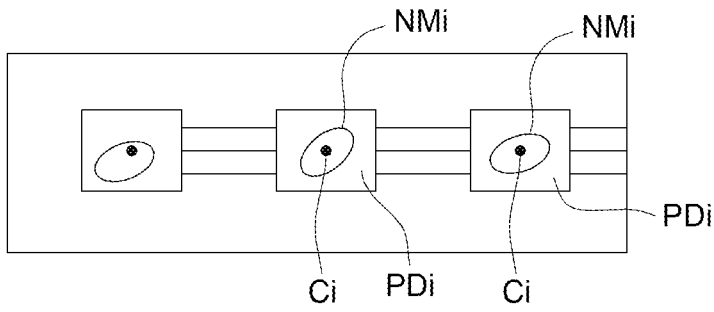
FIG. 3 is a schematic diagram of a plurality center points of the needle marks and the test pads of the testing probe set according to an embodiment of the present disclosure.

Please refer to FIG. 3, which is a schematic diagram of a plurality center points Ci of the needle marks NMi and the test pads PDi of the testing probe set 810 (shown in FIG. 4) according to an embodiment of the present disclosure. In order to improve the test accuracy, the needle marks NMi must be aligned with the center points Ci of the test pads PDi as much as possible.

Figure 4:
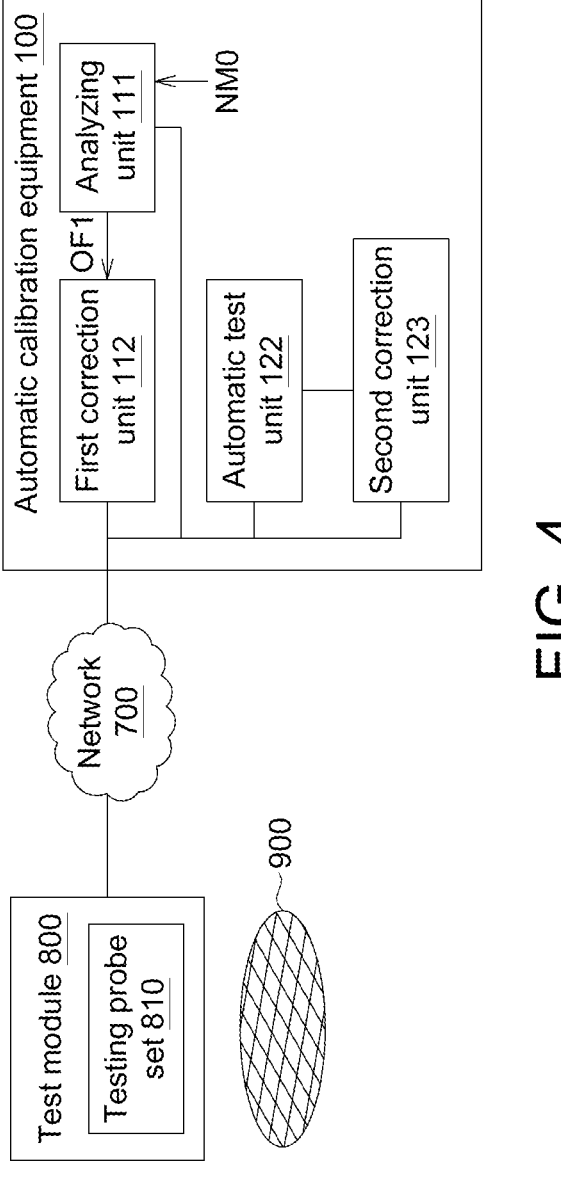
FIG. 4 illustrates a block diagram of an automatic calibration equipment of the testing probe set of the semiconductor process according to an embodiment of the present disclosure.

Please refer to FIG. 4, which illustrates a block diagram of an automatic calibration equipment 100 of the testing probe set 810 of the semiconductor process according to an embodiment of the present disclosure. A test module 800 includes the testing probe set 810. The testing probe set 810 is used to test the wafer 900 to be tested. The automatic calibration equipment 100 is connected to the test module 800 through a network 700. The automatic calibration equipment 100 includes an analyzing unit 111, a first correction unit 112, an automatic test unit 122 and a second correction unit 123. The analyzing unit 111 is used to analyze the needle marks NMi. The automatic test unit 122 is used to automatically test the wafer 900 to be tested. The first correction unit 112 and the second correction unit 123 are used to perform two corrections on the testing probe set 810.

The automatic calibration equipment 100 is, for example, a robotic process automation (RPA) device. The analyzing unit 111, the first correction unit 112, the automatic test unit 122 and/or the second correction unit 123 is, for example, a circuit, a circuit board, a storage device or a chip storing program code. The chip is, for example, a central processing unit (CPU), a programmable general-purpose or special-purpose micro control unit (MCU), a microprocessor, a digital signal processor (DSP), a programmable controller, an application specific integrated circuit (ASIC), a graphics processing unit (GPU), an image signal processor (ISP), an image processing unit (IPU), an arithmetic logic unit (ALU), a complex programmable logic device (CPLD), a field programmable gate array (FPGA), other similar components or a combination thereof.

In this embodiment, the automatic calibration equipment 100 could remotely analyze the offset of the needle marks NMi of the testing probe set 810, and pre-adjust the testing probe set 810 relative to the wafer before performing actual testing (or trial shotting). The relative position of 900 to be tested allows the needle marks NMi to be aligned with the center points Ci (shown in FIG. 3) of the test pads PDi (shown in FIG. 3). The operation of those components is illustrated with a flow chart as below.

Figure 5:
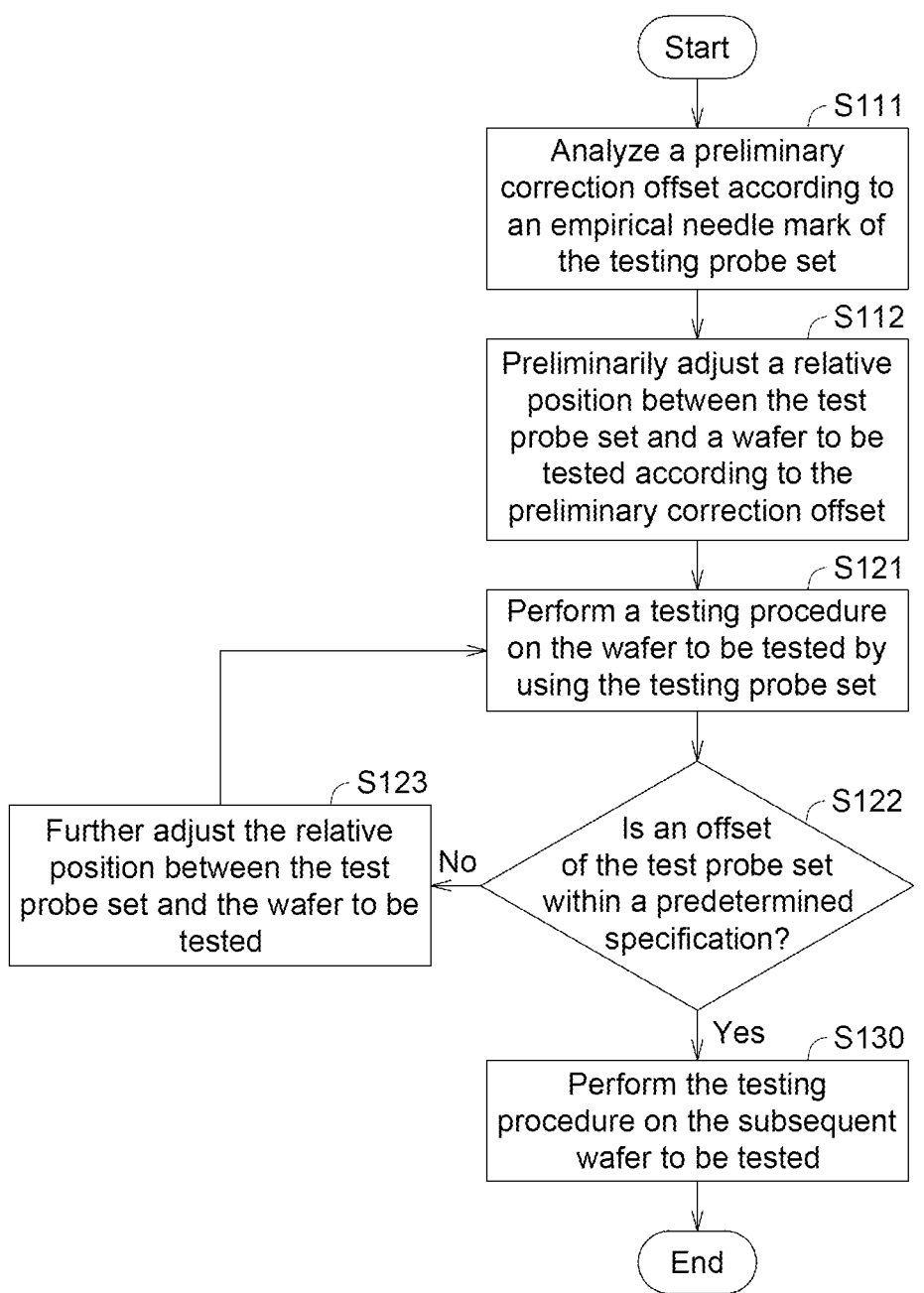
FIG. 5 illustrates a flow chart of an automatic calibration method of the testing probe set of the semiconductor process according to an embodiment of the present disclosure.

Please refer to FIGS. 4 and 5 at the same time. FIG. 5 illustrates a flow chart of an automatic calibration method of the testing probe set 810 of the semiconductor process according to an embodiment of the present disclosure. The automatic calibration method of the testing probe set 810 of the semiconductor process includes steps S111 to S112, S121 to S123, S130. In the step S111, the analyzing unit 111 analyzes a preliminary correction offset OF1 according to an empirical needle mark NM0 of the testing probe set 810.

In the step S111 of analyzing preliminary correction offset OF1, the empirical needle mark NM0 could be obtained according to the type, the length or the downforce of the testing probe set 810. Generally speaking, if the testing probe set 810 uses a softer material, the empirical needle mark NM0 may be longer. If the testing probe set 810 uses a longer probe, empirical needle mark NM0 may be longer. When testing probe set 810 is applied a larger downforce, the empirical needle mark NM0 may be longer.

Figure 6:
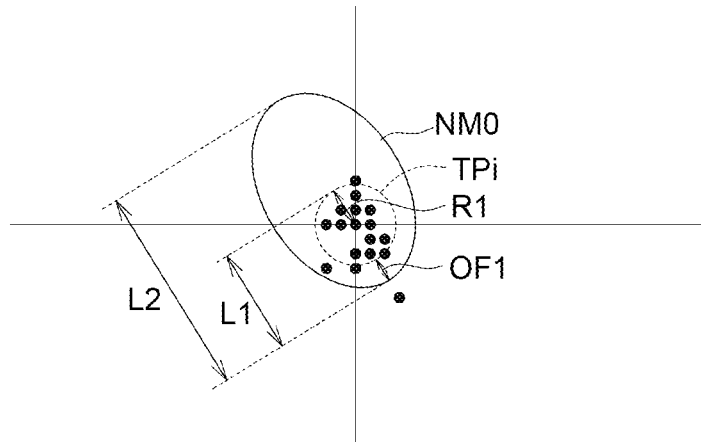
FIG. 6 illustrates an example of the step S111.

In the step S111, the analyzing unit 111 could analyze the preliminary correction offset OF1 according to the size of the empirical needle mark NM0 and/or the size of the testing probe set 810. Please refer to FIG. 6, which illustrates an example of the step S111. The analyzing unit 111 analyzes the a mark length L2 of the empirical needle mark NM0, and then obtains a half mark length L1 of the mark length L2. Next, the analyzing unit 111 deducts the radius R1 of the the test probes TPi of the testing probe set 810 from the half mark length L1 to obtain the preliminary correction offset OF1.

Figure 7:
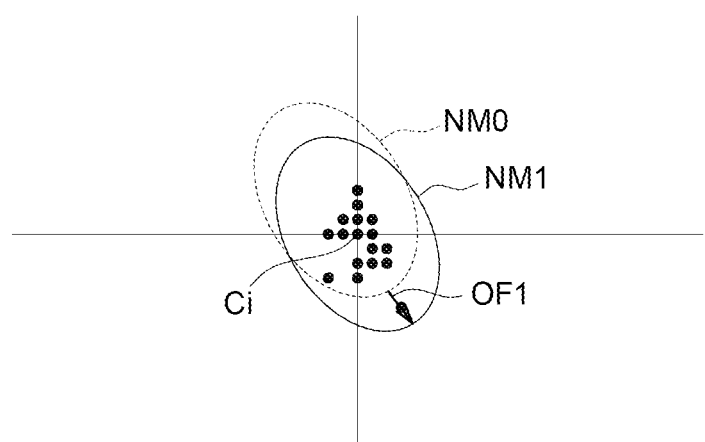
FIG. 7 illustrates an example of the step S112.

Then, in the step S112, the first correction unit 112 preliminarily adjusts the relative position of the testing probe set 810 to the wafer 900 to be tested according to the preliminary correction offset OF1. Please refer to FIG. 7, which illustrates an example of the step S112. After the preliminary correction offset OF1 is analyzed and obtained, the first correction unit 112 will adjust the relative position of the testing probe set 810 to the wafer 900 to be tested according to the obtained preliminary correction offset OF1, so that when the testing probe set 810 is pressed down, the needle marks NM1 can be aligned with the center points Ci of test pads PDi (shown in FIG. 3).

The step S112 is executed by the automatic calibration equipment 100 using RPA instead of being operated manually.

Then, in the step S121, the automatic test unit 122 uses the testing probe set 810 to perform a testing procedure on the wafer 900 to be tested. In this step, the automatic test unit 122 uses the testing probe set 810 to perform a first test (or trial shotting) on the wafer 900 to be tested to obtain the needle marks NMi. The step S112 is executed before the step S121. That is to say, before any test or trial shotting, the automatic calibration equipment 100 has been preliminary calibrated. If the preliminary calibration is successful, the test could be continued without wasting trial shotting materials and trial shotting time.

Figure 8:
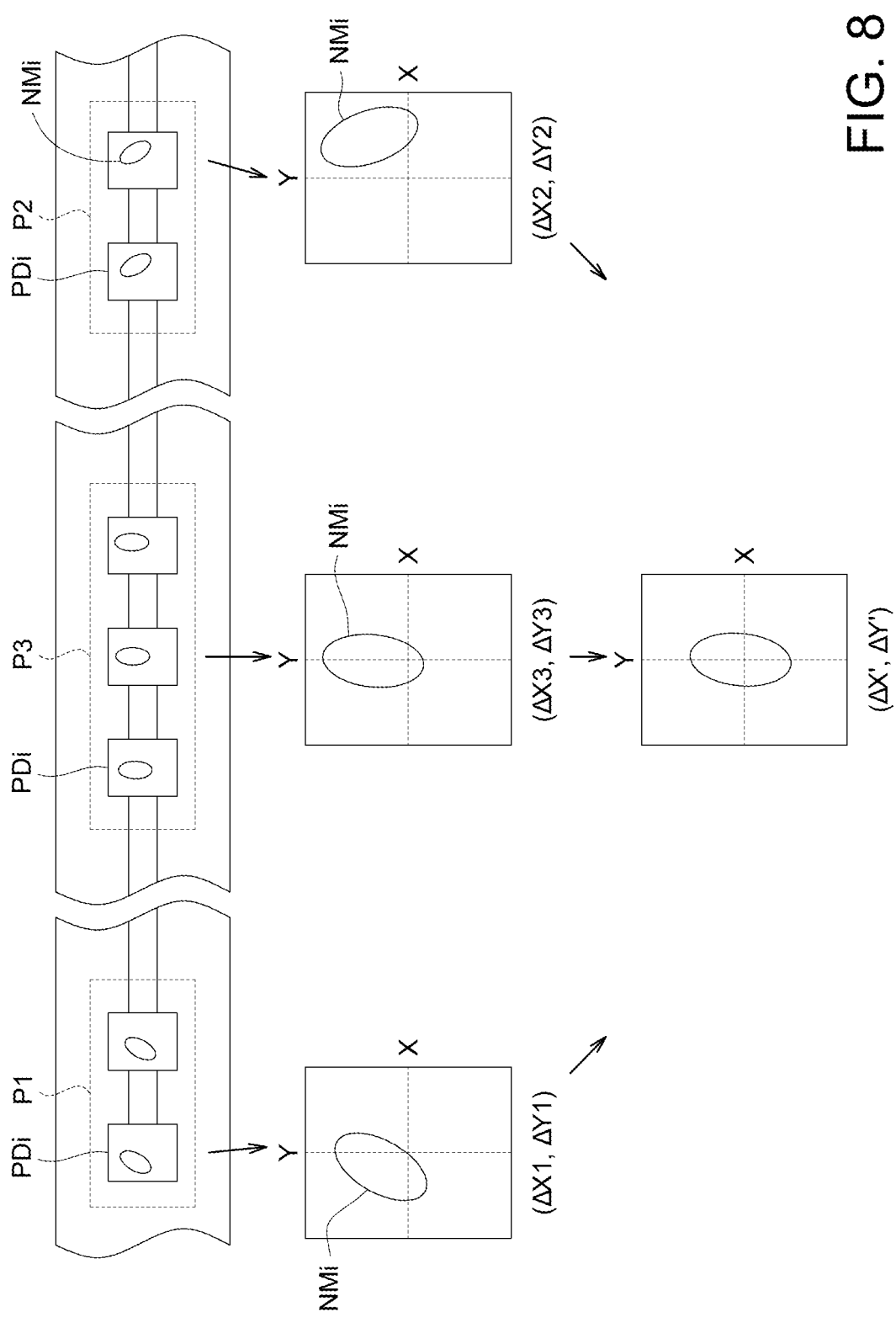
FIG. 8 illustrate an example of the step S122.

Then, in the step S122, the automatic test unit 122 automatically determines whether an offset of the testing probe set 810 is within a predetermined specification. The offset value of the predetermined specification is, for example, less than or equal to 1. Please refer to FIG. 8, which illustrate an example of the step S122. After the testing probe set 810 performs the testing procedure on wafer 900 to be tested, the needle marks NMi are obtained on the test pads PDi of the wafer 900 to be tested. The needle marks NMi are grouped into a peripheral part P1, a peripheral part P2 and a middle part P3. The number of needle marks NMi in corresponding peripheral parts P1 is two, the number of the needle marks NMi corresponding the peripheral part P2 is two, and the number of the needle marks NMi corresponding the middle part P3 is three.

The needle marks NMi corresponding the peripheral part P1 have an average horizontal offset $\Delta X1$ and an average vertical offset $\Delta Y1$. The needle marks NMi corresponding the peripheral part P2 have an average horizontal offset $\Delta X2$ and an average vertical offset $\Delta Y2$. The needle marks NMi corresponding the middle part P3 have an average horizontal offset $\Delta X3$ and an average vertical offset $\Delta Y3$.

The offset of testing probe set 810 has a horizontal offset $\Delta X'$ and a vertical offset $\Delta Y'$. The horizontal offset $\Delta X'$ is the average horizontal offset $\Delta X3$ of the middle part P3. The vertical offset $\Delta Y'$ is an average of the average vertical offset. $\Delta Y1$, the average vertical offset $\Delta Y2$, and the average vertical offset $\Delta Y3$.

The determination of whether the offset of the testing probe set 810 is within the predetermined specification is, for example, to determine whether the horizontal offset $\Delta X'$ is less than or equal to 1, and to determine whether the vertical offset $\Delta Y'$ is less than or equal to 1.

The determination of the step S122 is performed by the automatic calibration equipment 100 using the RPA, rather than by humans.

If the offset of the needle marks NMi after the first test (trial shotting) is within the predetermined specification, then the process proceeds to the step S130; if the offset of the needle marks NMi after the first test (trial shoting) exceeds the predetermined specification, then the process proceeds to the step S123.

In the step S130, the testing probe set 810 of the test module 800 continues to perform the testing procedure on the subsequent wafer 900 to be tested, without wasting the materials and time of the trial shotting at all.

In the step S123, the second correction unit 123 adjusts the relative position of the testing probe set 810 relative to the wafer 900 to be tested according to the offset of the needle marks NMi after the first test (trial shotting).

According to the above embodiments, before the wafer 900 to be tested is tested or tried, the automatic calibration method of the testing probe set 810 could be used to pre-adjust the relative position of the testing probe set 810 relative to the wafer 900 to be tested. As such, the testing probe set 810 is at the best position during the first test (or trial shotting), the unnecessary trial shotting procedure is omitted and the accuracy of the test is effectively improved.

The above disclosure provides various features for implementing some implementations or examples of the present disclosure. Specific examples of components and configurations (such as numerical values or names mentioned) are described above to simplify/illustrate some implementations of the present disclosure. Additionally, some embodiments of the present disclosure may repeat reference symbols and/or letters in various instances. This repetition is for simplicity and clarity and does not inherently indicate a relationship between the various embodiments and/or configurations discussed.

It will be apparent to those skilled in the art that various modifications and variations can be made to the disclosed embodiments. It is intended that the specification and examples be considered as exemplars only, with a true scope of the disclosure being indicated by the following claims and their equivalents.

What is claimed is:

1. An automatic calibration method for a testing probe set used in a semiconductor process, comprising:

analyzing a preliminary correction offset according to an empirical needle mark of the testing probe set;

preliminarily adjusting a relative position between the test probe set and a wafer to be tested according to the preliminary correction offset;

performing a testing procedure on the wafer to be tested by using the testing probe set;

automatically determining whether an offset of the test probe set is within a predetermined specification; and further adjusting the relative position between the test probe set and the wafer to be tested, if the offset of the test probe set exceeds the predetermined specification;

wherein in the analyzing the preliminary correction offset, the preliminary correction offset is analyzed according to a size of the empirical needle mark and a size of the testing probe set.

2. The automatic calibration method for the testing probe set used in the semiconductor process according to claim 1, wherein preliminarily adjusting the relative position between the test probe set and the wafer to be tested is performed before performing the test procedure on the wafer to be tested by using the testing probe set.

3. The automatic calibration method for the testing probe set used in the semiconductor process according to claim 1, wherein in the analyzing the preliminary correction offset, the empirical needle mark is obtained according to a type of the testing probe set.

4. The automatic calibration method for the testing probe set used in the semiconductor process according to claim 1, wherein in the analyzing the preliminary correction offset, the empirical needle mark is obtained according to a down-force applied to the testing probe set.

5. The automatic calibration method for the testing probe set used in the semiconductor process according to claim 1, wherein in the analyzing the preliminary correction offset, the empirical needle mark is obtained according to a length of the testing probe set.

6. The automatic calibration method for the testing probe set used in the semiconductor process according to claim 1, in the analyzing the preliminary correction offset, the preliminary correction offset is analyzed according to a size of the empirical needle mark.

7. The automatic calibration method for the testing probe set used in the semiconductor process according to claim 1, wherein the analyzing the preliminary correction offset includes:

analyzing a mark length of the empirical needle mark;

obtaining a half mark length of the mark length; and deducting a radius of a test probe of the testing probe set from the half mark length to obtain the preliminary correction offset.

8. The automatic calibration method for the testing probe set used in the semiconductor process according to claim 1, wherein the preliminarily adjusting the relative position between the test probe set and the wafer to be tested is performed by a robotic process automation (RPA) device.

9. The automatic calibration method for the testing probe set used in the semiconductor process according to claim 1, wherein the automatically determining whether the offset of the test probe set is within the predetermined specification is performed by a robotic process automation (RPA) device.

10. The automatic calibration method for the testing probe set used in the semiconductor process according to claim 1, wherein after the testing probe set performs the testing procedure on the wafer to be tested, a plurality of needle marks are obtained;

in the automatically determining whether the offset of the test probe set is within the predetermined specification, the offset includes a horizontal offset and a vertical offset, the horizontal offset is obtained according to the needle marks corresponding a middle part of the testing probe set, and the vertical offset is obtained according to the needle marks corresponding two peripheral parts of the testing probe set and the middle part of the testing probe set.

11. The automatic calibration method for the testing probe set used in the semiconductor process according to claim 10, wherein a number of the needle marks corresponding the middle part is three, and a number of the needle marks corresponding each of the peripheral parts is two.

12. An automatic calibration equipment for a testing probe set used in a semiconductor process, comprising:
   an analyzing unit, configured to analyze a preliminary correction offset according to an empirical needle mark of the testing probe set;
   a first correction unit, configured to preliminarily adjust a relative position between the test probe set and a wafer to be tested according to the preliminary correction offset;
   an automatic test unit, configured to perform a testing procedure on the wafer to be tested by using the testing probe set, and then automatically determine whether an offset of the test probe set is within a predetermined specification; and
   a second correction unit, configured to further adjust the relative position between the test probe set and the wafer to be tested, if the offset of the test probe set exceeds the predetermined specification;
   wherein the analyzing unit analyzes the preliminary correction offset according to a size of the empirical needle mark and a size of the testing probe set.

13. The automatic calibration equipment for the testing probe set used in the semiconductor process according to claim 12, wherein after the first correction unit preliminarily adjusts the relative position between the test probe set and the wafer to be tested, the automatic test unit performs the test procedure on the wafer to be tested by using the testing probe set.

14. The automatic calibration equipment for the testing probe set used in the semiconductor process according to claim 12, wherein the analyzing unit obtains the empirical needle mark according to a type of the testing probe set.

15. The automatic calibration equipment for the testing probe set used in the semiconductor process according to claim 12, wherein the analyzing unit obtains the empirical needle mark according to a downforce applied to the testing probe set.

16. The automatic calibration equipment for the testing probe set used in the semiconductor process according to claim 12, wherein the analyzing unit obtains the empirical needle mark according to a length of the testing probe set.

17. The automatic calibration equipment for the testing probe set used in the semiconductor process according to claim 12, wherein the analyzing unit analyzes the preliminary correction offset according to a size of the empirical needle mark.

18. The automatic calibration equipment for the testing probe set used in the semiconductor process according to claim 12, wherein
   after the automatic test unit performs the testing procedure on the wafer to be tested, a plurality of needle marks are obtained;
   when the automatic test unit determines whether the offset of the test probe set is within the predetermined specification, the offset of the test probe set includes a horizontal offset and a vertical offset, the horizontal offset is obtained according to the needle marks corresponding a middle part of the testing probe set, and the vertical offset is obtained according to the needle marks corresponding two peripheral parts of the testing probe set and the middle part of the testing probe set.

* * * * *